United States Patent
Liikanen et al.

(10) Patent No.: US 11,120,879 B2
(45) Date of Patent: Sep. 14, 2021

(54) ADJUSTMENT OF A VOLTAGE CORRESPONDING TO AN ERASE DISTRIBUTION OF A MEMORY SUB-SYSTEM IN ACCORDANCE WITH A SELECTED RULE

(71) Applicant: Micron Technology, Inc., Boise, ID (US)

(72) Inventors: Bruce A. Liikanen, Berthoud, CO (US); Michael Sheperek, Longmont, CO (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 16/534,097

(22) Filed: Aug. 7, 2019

(65) Prior Publication Data

US 2021/0043258 A1 Feb. 11, 2021

(51) Int. Cl.
*G11C 16/14* (2006.01)
*G11C 16/34* (2006.01)
*G06F 3/06* (2006.01)
*G11C 16/04* (2006.01)

(52) U.S. Cl.
CPC ............ *G11C 16/14* (2013.01); *G06F 3/0616* (2013.01); *G06F 3/0659* (2013.01); *G06F 3/0673* (2013.01); *G11C 16/3459* (2013.01); *G11C 16/0483* (2013.01)

(58) Field of Classification Search
CPC .......................... G11C 16/14; G11C 16/3459
See application file for complete search history.

(56) References Cited

U.S. PATENT DOCUMENTS

| | | | |
|---|---|---|---|
| 10,748,625 B1 * | 8/2020 | Sheperek | G11C 11/5628 |
| 2012/0254699 A1 * | 10/2012 | Ruby | G11C 29/028 |
| | | | 714/773 |
| 2014/0204671 A1 * | 7/2014 | Sharon | G11C 29/04 |
| | | | 365/185.09 |

* cited by examiner

*Primary Examiner* — David E Martinez
(74) *Attorney, Agent, or Firm* — Lowenstein Sandler LLP

(57) ABSTRACT

A processing device determines a set of difference error counts corresponding to multiple programming distributions of a memory sub-system. A valley having a lowest valley margin is identified based on a comparison of the set of difference error counts. Based on the set of difference error counts, a program targeting rule from a set of rules. A program targeting operation is performed, based on the program targeting rule, a program targeting operation to adjust a voltage associated with an erase distribution of the memory sub-system.

20 Claims, 9 Drawing Sheets

ADJUSTMENT OF A VOLTAGE CORRESPONDING TO AN ERASE DISTRIBUTION OF A MEMORY SUB-SYSTEM IN ACCORDANCE WITH A SELECTED RULE

TECHNICAL FIELD

Embodiments of the disclosure relate generally to memory sub-systems, and more specifically, relate to adjustment of a voltage corresponding to an erase distribution of a memory sub-system.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
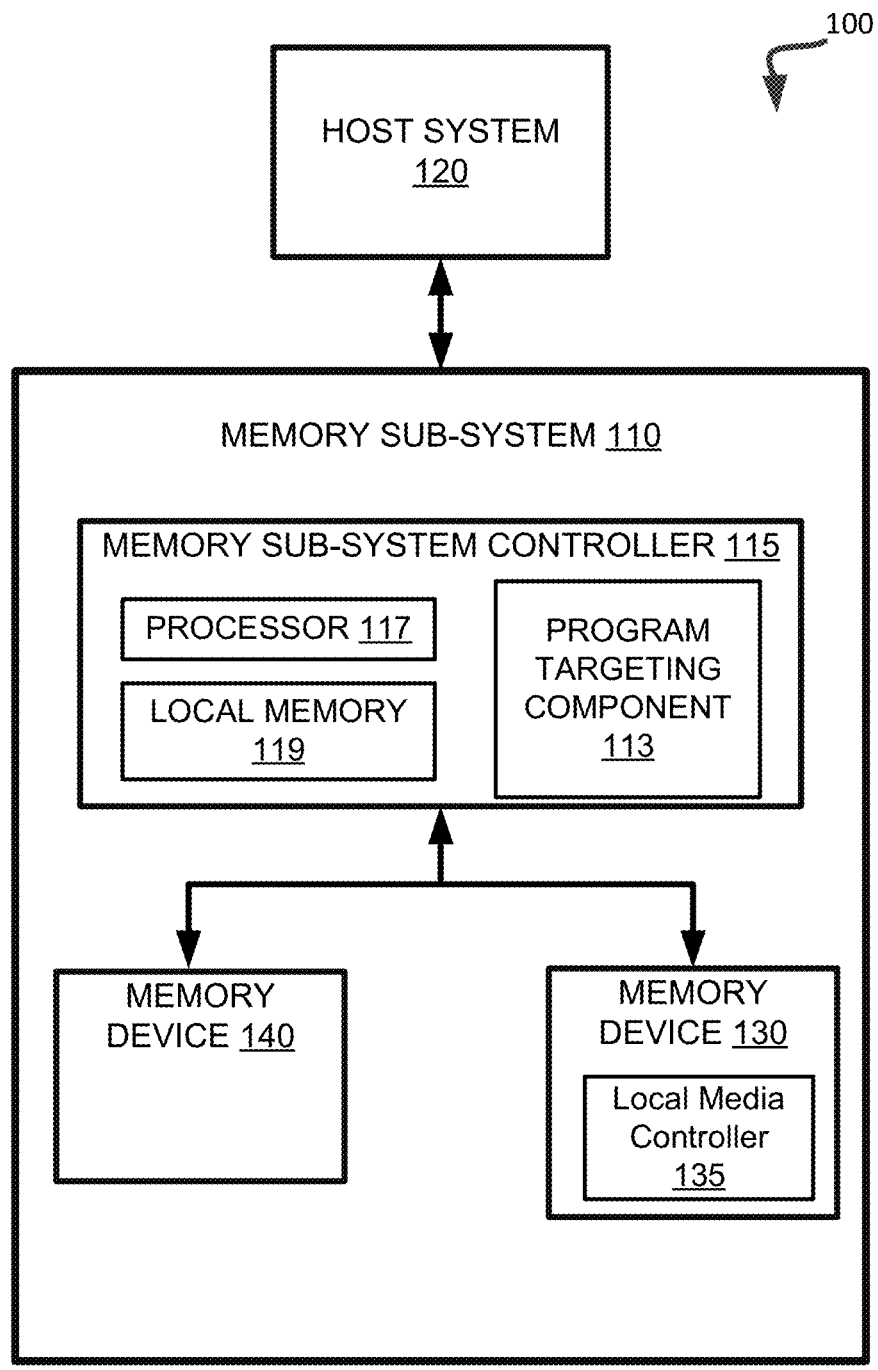
FIG. 1 illustrates an example computing environment that includes a memory sub-system in accordance with some embodiments of the disclosure.

Aspects of the present disclosure are directed to adjustment of voltage corresponding to an erase distribution of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system in accordance with multiple programming distributions. A continuous read level calibration (cRLC) operation continuously samples margins between programming distributions, also referred to as read threshold valleys or valleys. The valley margin can refer to a relative width between pairs of adjacent programming distributions. Valley margin can be correlated with a read window budget (RWB). Read window budget for a valley can refer to an absolute measurement in volts (e.g., millivolts (mV)) between two adjacent programming distributions.

Conventional memory sub-systems experience wear which causes an imbalance in the bit error rate (BER) between logical page types. This imbalance in BER between page types causes an increase in an average error correction trigger rate throughout the life of each die, including bringing end-of-life (EOL) conditions sooner due to a logical page type becoming dominant. In addition, the BER imbalance can result in a different RWB for the valleys of each logical page type, causing a decrease in endurance (i.e., fewer total Program/Erase cycles) for each die in a memory sub-system.

Aspects of the present disclosure address the above and other deficiencies by performing cRLC measurements for use with various types of program targeting operations (also referred to herein as "Dynamic Program Targeting (DPT) operations"). A program targeting (PT) operation controls the program verify (PV) target (e.g., a threshold voltage (Vt)) placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. The position of the erase programming distribution (i.e., L0) can be controlled (e.g., moved right or left) by adjusting the voltage of the erase (also referred to as "vera") to adjust the margin of a valley between the erase distribution and a first programming distribution (i.e., the L1 distribution).

Advantages of the present disclosure include, but are not limited to, controlling the PV target placement and the voltage of the erase programming distribution to improve the measured bit error rate (BER), trigger rate, trigger rate margin and read window budget (RWB) associated with a memory sub-system. According to embodiments, a lowest programming distribution and a highest distributions move along with the erase distribution to enable utilizing the full available RWB. In addition, allowing all of the programming distributions to move in a controlled manner results in an adjustment to the total RWB from the erase distribution to the highest programming distribution to take advantage of die to die variations for optimal placements rather than a fixed window placement of conventional memory sub-systems.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs), multi-level cells (MLCs), triple level cells (TLCs), and/or quad-level cells (QLCs). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a program targeting component 113 that performs operations as described herein. In some embodiments, the program targeting component 113 can be part of host system 120, controller 115, memory component 112N, an operating system, or an application. Program targeting component 113 can program the PV targets of one or more programming distributions (e.g., the second programming distribution, the last programming distribution, or both). For example, the controller 115 can include a processor 117 (processing device) configured to execute instructions stored in local memory 119 for performing the operations described herein.

A single-level cell (SLC) can store only one bit per memory element, whereas a multi-level cell (MLC) is a memory element that is capable of storing two bits of information. It should be noted that the state of the memory cell can be programmed and the state of the memory can be determined by comparing a read voltage of the memory cell against one or more read level thresholds. That is, with SLC NAND flash technology, each cell can exist in one of two states, storing one bit of information per cell, whereas MLC NAND flash memory has four possible states per cell, so each MLC-based cell can store two bits of information per cell. The higher number of possible states reduces the amount of margin (e.g., valley margin or voltage range) separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information with sixteen voltage states. For example, in a QLC memory, a memory cell can store four bits of data (e.g., 1111, 0000, 1101, etc.) corresponding to data received from the host system using the sixteen voltage states. It can be noted that operations herein can be applied to any multi-bit memory cells.

Each bit of the memory cell is stored at a different portion (also referred to as "logical page" hereafter) of the memory cell. Various read level thresholds can be used for the various logical page types (also referred to as "page types" herein): SLC logical page types are lower logical pages (LPs), MLC logical page types are LPs and upper logical pages (UPs), TLC logical page types are LPs, UPs, and extra logical pages (XPs), and QLC logical page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

In embodiments, the memory system receives a request from a host system to perform a programming operation to store data at the QLC memory (or other memory components having memory cells that store two or more bits). The memory system can store the data by performing multi-pass programming (e.g., two or more programming passes) that programs or stores data at the memory cell. A first programming pass can program data at the memory cell at a particular time. At a later time, a second programming pass can be performed on the memory cell to store additional data at the memory cell. The second programming pass uses the information stored in the first programming pass. A certain amount of time can elapse between the memory sub-system performing the first programming pass and performing the second programming pass on the same memory cell. During a first programming pass of a two-pass programming operation, one or more voltage levels can be applied to the memory cell to program a first set of bits (e.g., 3 bits in 3 logical pages). During a second programming pass of the two-pass programming operation, one or more voltage levels can be applied to the memory cell to program an additional bit to the first set of bits (e.g., 4 bits in 4 logical pages). The level that the memory cell is programmed to in the second programming pass can be based on the last logical page of the memory cell as well as the prior logical pages that were programmed at the memory cell in the first programming pass.

A continuous read level calibration (cRLC) operation continuously samples valley margins between programming distributions. The valley margin can refer to a relative width (also referred to as "margin" herein) between pairs of adjacent programming distributions. For example, valley margins associated with a particular logical page type can indicate the relative width between pairs of programming distributions associated with the particular logical page type. For instance, a valley margin of an upper logical page (e.g., valley 2 that is between the second distribution (L1) and the third distribution (L2)) that is larger than a valley margin of the upper logical page (e.g., valley 6 that is between the sixth distribution (L5) and the seventh distribution (L6)) can indicate that valley 2 is larger than valley 3, but does not explicitly recite the absolute width or size of either valley.

Valley margin can be correlated with a RWB. Read window budget for a valley can refer to an absolute measurement in volts (e.g., millivolts (mV)) between two adjacent programming distributions. For example, the RWB for a first valley can be 270 mV and the RWB for second valley can be 250 mV. If, for example, the first valley margin is larger than the second valley margin, then a correlation that the RWB of the first valley margin is larger than the RWB of the second valley margin can be made.

In some instances, a value for RWB is not readily measureable. A difference error count (Diff-EC) can be readily measured (e.g., by the cRLC operation) and can be correlated to a valley margin and relative RWB of valleys for a particular logical page type. Diff-EC is a metric derived from measurements taken at a valley between two adjacent programming distributions. In some embodiments, Diff-EC is inversely proportional to valley margin. For example, two valleys of a particular logical page type with the same Diff-EC value have approximately the same valley margin. Since the two valleys have the same valley margin, it can be inferred that the two valleys have approximately the same RWB, even though the absolute RWB is not measured. If a first valley of a first logical page type has a higher Diff-EC than a second valley of the first logical page type, it can be inferred that the first valley has less valley margin than the second valley, and that the first valley has less RWB than the second valley.

The cRLC operation is a read level calibration that can be done for each of the multiple read level threshold registers used during all read operations. A read level threshold register can store a value that indicates the read level threshold voltage for a particular valley. The cRLC operation can be performed to keep each read level threshold centered so that the memory component can achieve the best overall bit error rate (BER) possible. The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered). In one implementation, a sample is three reads from the same read threshold valley (e.g., also referred to as "valley" or "Vt distribution valley" herein). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory component, etc.) that is calibrated or converged by cRLC has a center value that corresponds to a read level threshold (or read level trim) that is centered in or at a lowest point in the read threshold valley. A memory cell (or WLG or memory component, etc.) that is calibrated or converged by cRLC has a center value that results in a lowest bit error rate (BER). BER can refer to a ratio of a number of bits in error of a data vector divided by a total number of bits for the given data vector. BER can correspond to a particular logical page type. For example, a particular logical page type has a particular BER and another logical page type has another BER. A trim can refer to digital value that is used for a circuit, such as a register, that is converted into an analog voltage value. For example, the read level threshold trims can be programmed into a trim register, which produces a read level threshold voltage used to read data from a memory cell.

The cRLC operation measures and collects information about the valley margins, such as the center bit error count (CenterEC) and the Diff-EC measurements. CenterEC is a metric indicative of the average error count for the center sample of each trim (e.g., each read level threshold). Average CenterEC can refer to the average error count for all the read level thresholds of a particular logical page type. Average CenterEC for a particular page logical type can be indicative of a relative BER of the logical page type with respect to other logical page types. For example, a first logical page type is associated with an average CenterEC that is greater than the average CenterEC of a second logical page type. Since the first logical page type has a greater average CenterEC than the second logical page type, it can be inferred that the BER of the first logical page type is higher than the BER for the second logical page type. The cRLC measurements can also be used for various types of program targeting operations (also referred to as "Dynamic Program Targeting (DPT) operations" herein).

A program targeting (PT) operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding programming distribution. The programming distribution can illustrate the range of threshold voltages (e.g., normal distribution of threshold voltages) for memory cells programmed at a particular PV target. The PT operation is a PV targeting calibration that can be done for each PV target. The PT operation can be considered as a set of one or more operations to adjust or calibrate the placement of the PV targets. The PT operation calibrates multiple logical page types such that the BER of each logical page type will be approximately the same through the life of the memory system and through all operating environments (e.g., minimizes BER). Additionally, the PT operation calibrates each particular logical page type to equalize the widths of valleys of each particular logical page type such that the RWBs for the valleys of each particular logical page type are approximately the same. For example, the PT operation can adjust the three TLC logical page types; lower logical page (LP), upper logical page (UP), and extra logical page (XP) such that the BER of each of these three logical page types will be approximately the same (i.e., balanced). The PT operation uses the cRLC as the feedback metric in a closed loop feedback system. The PT operation, in addition to balancing logical page type BER, keeps the BER of each logical page type balanced dynamically by performing the PT operation during block programming, such as between the first programming pass and the second programming pass of a multi-pass programming operation on a block. Balancing the BER can reduce the average error correction trigger rate throughout the life of each die, including end-of-life (EOL) conditions. By adjusting PV targets, PT effectively moves the programming distributions in the direction of the adjusted PV targets. PT calibration (e.g., adjusting the PV targets) can result in equalization of valley margins of a particular logical page type so that the valley margins are converged at a particular convergence value and the valley margins for a particular page type are approximately equal. PT calibration can also include balancing the BER of each logical page type so that each valley associated with a particular logical page has roughly similar RWB.

The PT operation can increase endurance (i.e., increase the total Program/Erase cycles) for each die in a memory system. In an embodiment, using the PT operation avoids one logical page type dominating the end of life criteria. The PT operation can be performed independently for each word line group. The PV targets of the memory component can start with manufacturing default PV targets. The PT operation can be run during a test mode so that all PV targets of all word line groups (WLGs) of all dies in the memory system have been balanced (i.e., when the BERs of the logical page types are approximately the same). In the test mode, the cRLC and PT operations can run at an accelerated rate for a short period of time at manufacturing so that each WLG will have optimized and converged the cRLC read level thresholds prior to deployment. The cRLC and PT operations can be performed in an interleaved or concurrent method so that the memory sub-system is continually maintained at its optimum and controlled valley margin through the life of the memory sub-system.

In operational mode (e.g., when in operation in the field), the cRLC and PT operations can be run dynamically to extend the usable lifetime of the memory components of the memory sub-system. The term "dynamic" as used herein can refer to processes, functions, operations, or implementations that occur during operation, usage, or deployment of a corresponding device, system, memory sub-system, or embodiment, and after or while running the manufacturer's or third-party firmware. The dynamically occurring processes, functions, operations, or implementations can occur after or subsequent to design, manufacture, and initial testing, setup or configuration (e.g., after test mode). In some conventional memory sub-systems, PV targets of the memory component are set with manufacturing default PV targets, and the default PV targets are not changed at any point during the life of the memory component. In other conventional memory sub-systems, some PV targets of the memory component are changed dynamically in the field. However, the PV target of the programming distribution adjacent (also referred to as the "second programming distribution" herein) to the initial programming distribution and the last programming distribution are not part of the group of PV targets that are allowed to be changed or adjusted.

The initial programming distribution (L0) (i.e., the erase distribution) is sensitive to disturb effects, such as program disturb and read disturb. For example, a read disturb is where a read of one row of memory cells impacts the threshold voltages of unread memory cells in different rows of the same block. A program disturb error occurs when one or more memory cells not intended to be programmed are changed (e.g., bits representation is changed) during a program operation on other memory cells that are proximate to the one or more memory cells. The disturb effects can cause the initial programming distribution (L0) to move up towards the adjacent programming distribution (e.g., the second programming distribution (L1)), such that the initial programming distribution (L0) and the second programming distribution (L1) overlap, which causes bit errors and reduces reliability of the memory component.

Additional available margin or RWB used to calibrate a memory cell can positively influence the endurance of the memory cell, and hence improve the endurance of the memory component. Available margin or RWB can theoretically be used to adjust programming distributions in one direction or another and make the margins between programming distributions wider (or more narrow). Having additional available margin increases the ability of the memory sub-system to adjust the PV targets of programming distributions (e.g., move programming distributions), such that margin between programming distribution is maintained over the life of the memory cell even in view of wear effects that shift or spread the programming distributions. Endurance can refer to the number of program and erase cycles a memory cell is cable of performing within the useful life of the memory cell.

For example, by allowing for the adjustment of the voltage of the initial programming distribution and the last programming distributions, the default margin between the initial programming distribution and the second programming distribution can be initially set at distance that is less than if the initial programming distribution and the second programming distribution were guard banded. As the memory cell starts to wear over time, the initial programming distribution (L0) can drift higher. The PT operation to calibrate the memory cell can compensate for the wear by moving one or more of the PV targets of the programming distributions from L1 to the last programming distribution up a same magnitude (e.g., in an "accordion-like" manner). The PT operation can continue to calibrate over the life of the memory component. Over time, similar accordion-like calibration operations can be performed until the PV target of the last programming distribution hits an upper limit (e.g., before exceeding the top voltage level limit) above which the PV target of the last programming distribution is not allowed to exceed. The PT operation can continue to calibrate the memory cell by taking margin from a valley of another logical page type and giving the margin to the valley (V1) between the initial programming distribution and the second programming distribution. By allowing the position of the initial programming distribution and the last programming distribution to be adjusted over the life of the memory component to adjust in cases when the valley between the initial programming distribution and the second programming distribution is identified as the most needy (e.g., having the lowest relative width among the valleys between the multiple programming distributions). Accordingly, the memory component is better able to compensate for wear to its memory cells, which improves endurance of the memory component.

Aspects of the disclosure address the above challenges by performing a program targeting operation to calibrate one or more PV targets associated with the programming distributions of a memory cell. In some embodiments, the PT operation determines one or Diff-ECs that are indicative of relative widths of valleys that are located between programming distributions of a memory cell of the memory component. The Diff-ECs can be received from a cRLC operation. The processing device performs a program targeting operation on the memory cell to calibrate one or more program verify (PV) targets associated with the programming distributions. To perform the program targeting operation, the processing device selects a rule from a set of rules based on the one or more Diff-ECs. The set of rules correspond to an adjusting of a voltage (i.e., the vera) of the erase distribution, a PV target of a last programming distribution, or both.

In some embodiments, the PT operation implements the set of rules to balance the logical page types such that the BER for different logical page types is approximately the same. In selecting a rule form the set of rules, the PT operation identifies two logical page types. Each of the logical page types can have a BER, which can be inferred by an average CenterEC for each of the logical page types. If the BER of the first logical page type is less than the BER of the second logical page type, then a first subset of rules is identified from the set of rules. The first subset of rules includes rules that each give margin to the second logical page type, and take margin from the first logical page type. If the BER of the first logical page type is greater than the BER of the second logical page type, then a second subset of rules is identified from the set of rules. The second subset of rules includes rules that each give margin to the first logical page type, and take margin from the second logical page type. Using the PT operation, logical page types with higher BER are given margin from logical page types with lower BER, such that over time the PT operation balances the BER between the logical page types.

To select a particular rule from the first subset of rules, the PT operation identifies a valley of the second logical page type that has the least margin. The valley of the second logical page type that has the least margin is the valley of the second logical page type that has the highest Diff-EC (also referred to as the "most needy" valley margin). The PT operation further identifies a valley of the first logical page type that has the most margin. The valley of the first logical page type that has the most margin is the valley of the first logical page type that has the lowest Diff-EC (also referred to as the "least needy" valley margin). The PT operation can identify a rule from the first subset of rules that gives margin to the valley of the second logical page type that has the least margin of any valley of the second logical page type, and takes margin from the valley of the first logical page type that has the most margin of any valley of the first logical page type. The selected rule can identify the PV targets to be adjusted and the magnitude and direction the PV targets are to be adjusted to perform the above aforementioned. As such, the PT operation over time balances the BER between logical page types and equalizes the relative widths of the valleys for a particular logical page type.

To select a particular rule from the second subset of rules, the PT operation identifies a valley of the first logical page type that has the least margin. The valley of the first logical page type that has the least margin is the valley of the first logical page type that has the highest Diff-EC. The PT operation further identifies a valley of the second logical page type that has the most margin. The valley of the second logical page type that has the most margin is the valley of the second logical page type that has the lowest Diff-EC. The PT operation can identify a rule from the second subset of rules that gives margin to the valley of the first logical page type that has the least margin of any valley of the first logical page type, and takes margin from the valley of the second logical page type that has the most margin of any valley of the second logical page type. The selected rule can identify the PV targets to be adjusted and the magnitude and direction the PV targets are to be adjusted to perform the above aforementioned PT operation. As noted above, the PT operation over time balances the BER between logical page types and equalizes the relative widths of the valleys for a particular logical page type.

Being able to adjust the PV targets of the second programming distribution and the last programming distribution from the default PV targets allows the PT operation to increase the amount of available margin or RWB used to calibrate a memory cell during the memory cell's lifetime. By increasing an amount of margin or RWB available to the PT operation, the PT operation can perform additional PV target adjustments (e.g., as articulated in the set of rules described herein). The additional PV target adjustments that include adjustments to the PV targets to the second programming distribution, the last programming distribution, or both allows the memory component to better compensate for wear to its memory cells over the memory component's lifetime, which improves endurance of the memory component.

It can be noted that for the sake of illustration, rather than limitation, the PT operation is described as balancing the logical page types and equalizing the valleys of a particular logical page type as described above. It can be noted that in other embodiments, PT operations can be used to control the BER of each logical page type to be different using a scaling factor. PT operations can also be used to control the valley margins of a particular logical page type to be different using a scaling factor. Although the PT operation is described herein balancing logical page types and equalizing the valleys of a particular logical page type, aspects of the present disclosure can be used where the PT operation controls the valley margins of a particular logical page type or the BER between logical page types using a scaling factor.

It can also be noted that for the sake of illustration, rather than limitation, aspects of the present disclosure are described with respect to QLC memory. It can be noted that aspects of the present disclosure can apply to any multi-bit memory, such as TLC, or other multi-bit memory.

Figure 2A:
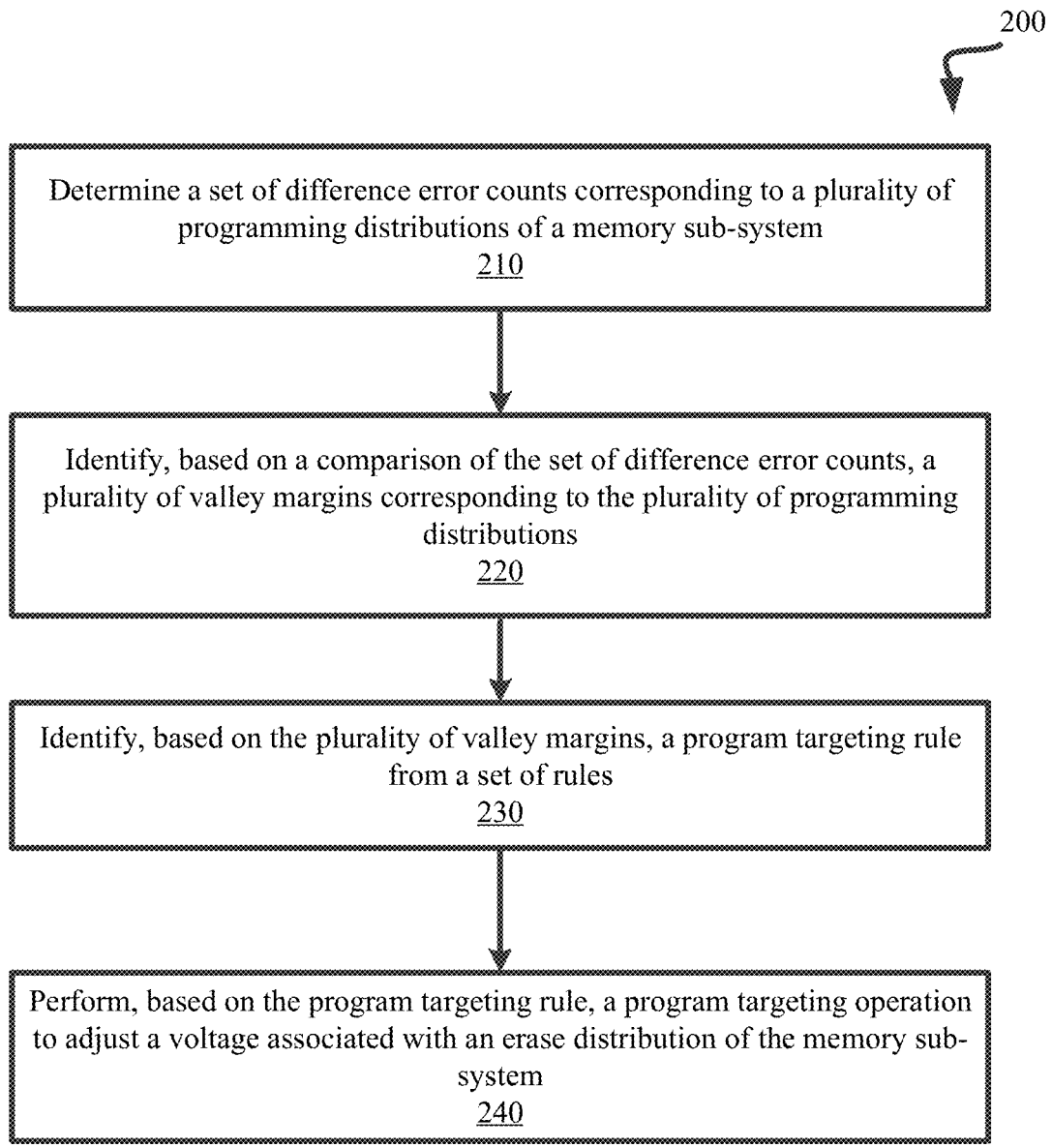
FIG. 2A is a flow diagram of an example method to use a set of rules that correspond to an adjusting of a voltage of an erase distribution, in accordance with some embodiments of the disclosure.

FIG. 2A is a flow diagram of an example method 200 to identify a second programming distribution adjacent to an erase distribution has a smallest relative valley margin and adjust a voltage of an erase distribution (i.e., the initial programming distribution), in accordance with some embodiments of the disclosure. The method 200 can be performed by processing device that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the program targeting component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device determines a set of difference error counts corresponding to a plurality of programming distributions of a memory sub-system. In some embodiments, to determine one or more difference error counts for a difference error, the processing device performs a cRLC operation on the memory cell to calibrate read level thresholds between the programming distributions.

In embodiments, to perform the cRLC operation on the memory cell to calibrate the read level thresholds between the programming distributions, the processing device adjusts the read level thresholds to a center value that results in a lowest bit error rate. In embodiments, to perform the cRLC operation on the memory cell to calibrate read level thresholds between the programming distributions, the processing device samples the center value, a positive offset value, and a negative offset value between one or more of the programming distributions of the memory cell. The difference error count for a particular valley is determined using the center value, the positive offset value, and the negative offset value of the valley. The aforementioned values are measurements taken at a valley between adjacent programming distributions. A center value can be the lowest point in the valley. The positive offset value is a positive value (e.g., positive voltage value) from the center value. The negative offset value of the valley can be a negative value (e.g., negative voltage value) from the center value. In some embodiments, the positive offset value and the negative offset value are of the same magnitude. In some embodiments, Diff-EC is the mean of the positive offset value and the negative offset value less the center value. Center value, the positive offset value, and the negative offset value of the valley are further described with reference to FIGS. 3A and 3B.

In one embodiment, when a read sample is taken, three reads are performed in sequence, including a low Vt read, a high Vt read, and a center Vt read. The center Vt read is a register value that is a cRLC center value, the low Vt read is a register value that is the cRLC center value less a negative offset value, and the high Vt read is a register value that is the cRLC center value plus a positive offset value. If a read level threshold were to be swept by a BER sweep, the cRLC center value should be the lowest value in the valley between an adjacent pair of programming distributions. However, when the memory cell is not calibrated, the cRLC center value is not the lowest. In calibration, the cRLC operation centers the cRLC center value by balancing the side samples. In embodiments, in balancing the side samples the positive offset value and negative offset value are of equal magnitude. In some embodiments, to calibrate the read level thresholds, the cRLC operation balances the side samples for at least a particular logical page type. For example, for a particular logical page type all the respective positive offset values and the negative offset values are of equal magnitude for all the respective valleys. When the side samples are nearly equal (balanced), the cRLC center value can become centered at the deepest point in the BER sweep. For the read sample, the Diff-EC can be computed. More specifically, the Diff-EC measurement is the mean of the two side samples minus the center value. The Diff-EC is the difference between the average of the positive and negative offset sample bit error rate counts and the center sample bit error count. Also, the center bit error count (CenterEC) is calculated. These values can be used to determine where the read level threshold should be set. The best BER for a logical page exists when all read level thresholds for that logical page type are centered by cRLC and the RWB for each logical page type valleys are approximately the same. The Diff-EC and CenterEC can be stored and used by the PT operation as feedback information in setting the PV targets. In some embodiments, after cRLC calibrates the read level thresholds between the programming distributions (e.g., second pass programming distributions), processing device proceed to operation 210. The cRLC operation is further described below with respect to FIG. 3A and FIG. 3B.

In an embodiment, the relative widths of the valleys corresponding to the plurality of programming distribution can be determined based on the set of difference error counts. In an embodiment, the respective difference error counts corresponding to the programming distributions are indicative of relative widths of valleys that are located between programming distributions of a memory cell of the memory component. In embodiments, the difference error count is inversely proportional to the valley widths (e.g., valley margin).

Figure 4:
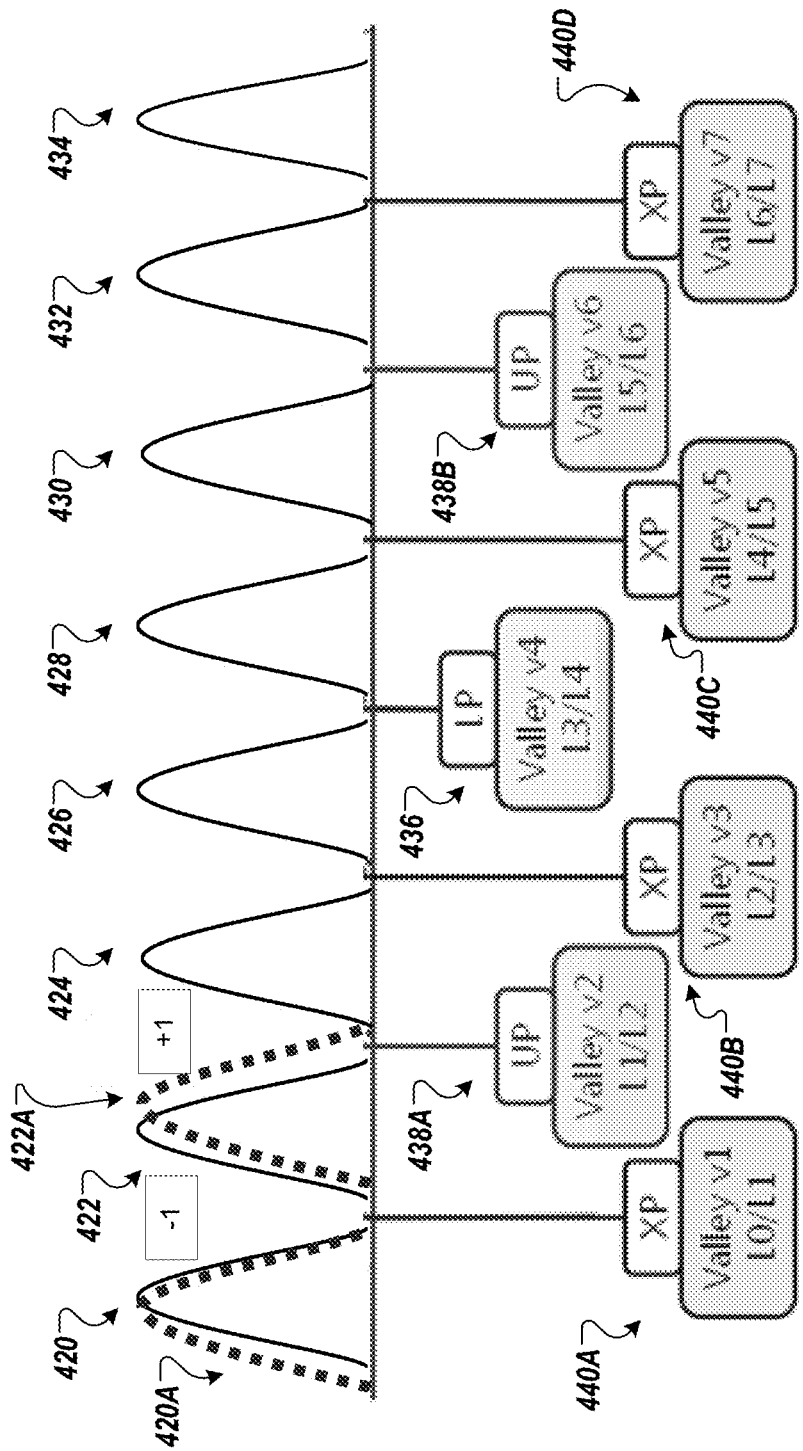
FIG. 4 illustrates eight programming distributions, including two programming distributions after at least two of program verify targets are adjusted according to a program targeting (PT) operation, in accordance with some embodiments of the disclosure.

At operation 220, the processing device identifies, based on a comparison of the set of difference error counts, multiple valley margins corresponding to the multiple programming distributions, according to embodiments. In an embodiment, the programming distribution adjacent to the erase distribution (i.e., the second programming distribution or L1 as shown in FIG. 4) is identified as the most needy (i.e., has the lowest relative valley margin) based on a comparison of the difference error counts corresponding to the respective programming distributions. In an embodiment, a valley associated with a lower page (LP) is identified as having the lowest valley margin (i.e., the most needy valley), such as the valley between programming distribution L7 and programming distribution L8 based on a comparison of the difference error counts corresponding to the respective programming distributions. In an embodiment, the processing device determines that the valley between the erase distribution (L0) and the second programming distribution (L1) (i.e., valley v1) has the highest relative difference error count and as a result represents the most needy valley.

At operation 230, the processing device identifies, based on the plurality of valley margins, a program targeting rule from a set of rules. In some embodiments, to select the rule from the set of rules based on the, processing device selects the rule from the set of rules that identifies the at least two program verify (PV) targets describing an adjusting such that a relative width of a valley that has a lowest difference error count (Diff-EC) of the valleys of a first logical page type is decreased and a relative width of a valley that has a highest Diff-EC of the valleys for a second logical page type is increased. Selecting a rule from a set of rules is further described with respect to FIG. 2B and FIG. 5A through FIG. 5C. According to embodiment, in addition to adjustment of the PV target associated with the erase distribution, one or more additional PV targets can be adjusted (e.g., in an accordion-like manner). In some embodiments, not all PV targets are adjusted. For example, the PV targets of the second distribution (e.g., L1) and last programming distribution (L15) can be fixed and only one or more of the intervening PV targets are adjusted to achieve net-zero adjustments. Net-zero adjustments are further described with reference to FIG. 4. According to embodiments, application of a set of rules (e.g., the set of rules of shown in the examples illustrated in FIGS. 5A, 5B, and 5C) can be based on system requirements, market requirements, and/or memory subsystem behavior characteristics. For example, the sets of rules shown in FIGS. 5A and 5B differ by allowing a top level to move up, which can result in an improving of a trigger margin such that error recovery is entered less often, but where a reduction of endurance can occur.

In another embodiment, the set of rules includes a rule to allow for an adjustment of the PV target for the erase programming distribution (L0) and an adjustment of the PV target of a last programming distribution (e.g., L15 for QLC memory). In some embodiments, the last programming distribution corresponding to one of the programming distributions of the memory cell having a highest PV target. For example, in a TLC (L0-L7) and QLC (L0-L15) memory the set of rules can allow for the adjusting of the PV targets for L7 or L15 programming distributions, respectively.

For example, in a TLC (L0-L7) or QLC (L0-L15) memory the set of rules can include a rule to allow for an adjustment of the PV target for the erase (L0) programming distribution (L0) and locking a last programming distribution (e.g., L15 for QLC memory) such that the locked distribution (e.g., L15 in FIG. 5A) is not moved. In an embodiment, according to this rule, instead of moving the second distribution (L1) in response to identifying that distribution as having the most needy valley margin (e.g. valley v1), the rule enables the erase distribution to move in an opposite direction (e.g., the erase distribution is moved to the left to provide more margin to valley v1, while locking the last programming distribution (e.g., L15). In an example, in a QLC memory the set of rules can allow for PV target of the last programming distribution (L15) to be locked. Locking can refer to a programming distribution or respective PV target that has no rule in the set of rules that allows the programming distribution or PV target to move. The programming distribution is locked such that the PV target is not adjusted in a subsequent PT operation. In some embodiments, the rule that corresponds to an adjusting of a PV target of the erase distribution in view of a second programming distribution (L1) corresponding to a lowest PV target and to a locking of a PV target of a last programming distributions corresponding to a highest PV target is further described with respect to FIG. 5A.

Figure 5A:
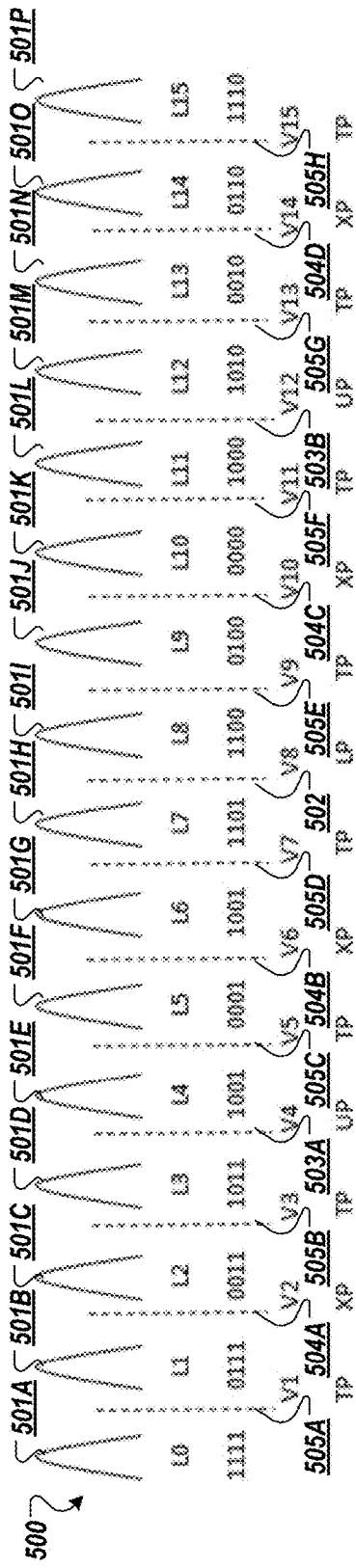
FIG. 5A illustrates an example set of rules that correspond to adjusting a voltage of an erase programming distribution and to a locking of a program verify target of a last programming distribution, in accordance with embodiments of the disclosure.
Figure 5B:
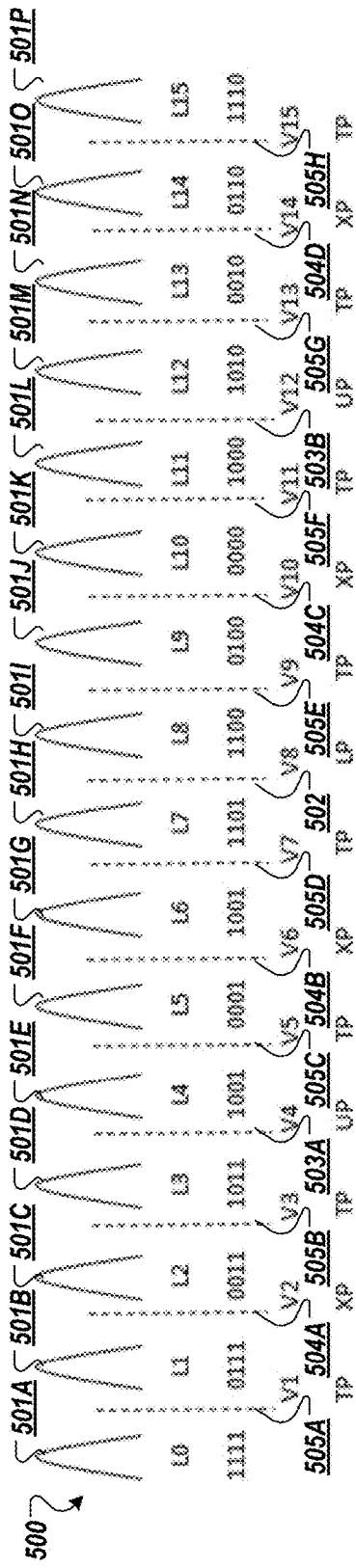
FIG. 5B illustrates an example set of rules that correspond to adjusting a voltage of an erase programming distribution last programming distribution, in accordance with embodiments of the disclosure.

In another embodiment, the set of rules includes a rule to allow for an adjustment of the PV target for the erase programming distribution (L0) and an adjustment of the PV target of a last programming distribution (e.g., L15 for QLC memory), as shown in FIG. 5B.

In some embodiments, the set of rules correspond to adjusting the erase distribution and locking a PV target of a second programming distribution adjacent to the erase distribution, where the second programming distribution corresponds to the most needy valley (e.g., valley v1 is the most needy). A rule of the set of rules that corresponds to adjusting the PV target of the erase distribution a programming distribution corresponding to a highest PV target and a locking of a PV target of a programming distribution adjacent to an initial programming distribution corresponding to a lowest PV target is further described in at least FIG. 5B.

In some embodiments, the set of rules correspond to an adjusting of a PV target of an erase distribution adjacent to a second programming distribution (L1) corresponding to a lowest PV target and an adjusting of a PV target of a last programming distribution corresponding to a highest PV target. For example, in a TLC memory the set of rules can allow for the adjusting of the second programming distribution (L1) and the last programming distribution (L7). In another example, in a QLC memory the set of rules can allow for the adjusting of the second programming distribution (L1) and the last programming distribution (L15). In an embodiment, when valley v1 is identified as the most needy valley in operation 220, the rule can include adjusting the voltage of the erase distribution to move the erase distribution to increase the valley margin of valley v1, instead of moving all of the PV target levels of the other programming distributions (e.g., L1-L15) higher. A set of rules that corresponds to an adjusting of a PV target of an erase distribution, locking a PV target of the second programming distribution (L1) and adjusting of a PV target of a last programming distribution corresponding to a highest PV target is further described in at least FIG. 5C.

At operation 240, the processing device performs, based on the program targeting rule, a program targeting operation to adjust a voltage associated with an erase distribution of the memory sub-system. In an embodiment, the program targeting operation calibrates the memory cell by adjusting the voltage of the erase distribution ad one or more PV targets associated with the other programming distributions (e.g., L1-L15).

In some embodiments, the program targeting operation implements a set of rules to balance logical page types such that the BER is approximately the same for different logical page types and to equalize relative width of valleys of a particular such that the RWB for the valleys of the particular logical page type are approximately the same. Program targeting operation calibration converges Diff-EC for at least a particular logical page type to a convergence value. For example, after cRLC convergence, the Diff-EC measurements obtained via the cRLC operation are passed to the PT operation. For a TLC memory cell, PT calibration converges the Diff-EC measurements for valleys 1-7 to a convergence value (e.g., Diff-EC of approximately 60) so that each valley has roughly similar RWBs and the different logical page types have a similar BER.

In some embodiments, processing device can perform the program targeting operation responsive to a satisfaction of one or more conditions. For example in operational mode, the program targeting operation can be performed responsive to satisfying a threshold amount of time (e.g., a threshold number of days since the previous PT operation was performed), In another example, in operational mode, the program targeting operation can be performed responsive to satisfying a threshold number of cRLC operations (e.g., responsive to performing 30 cRLC cycles since the most recent PT operation was performed). In another example, in operational mode, the program targeting operation can be performed responsive to satisfying a threshold number of memory operations (e.g., responsive to X number of write operations).

In some embodiments, to calibrate the one or more PV targets associated with the programming distributions, processing device determines a net-zero adjustment to at least two PV targets associated with the programming distributions based on two or more difference error counts. Processing device adjusts the at least two PV targets according to the net-zero adjustment.

In another embodiment, the memory component includes a block with multiple memory cells organized in wordlines and wordline groups. The memory cell can be a sample memory cell of a first wordline group of the multiple wordline groups. The block can further include a second sample memory cell in a second wordline group of the multiple wordline groups. In embodiments, a program targeting operation can be performed on a wordline group of multiple wordline groups of a block independently from other wordline groups of the multiple wordline groups of the block.

Operations described herein can be performed on a data block (e.g., a group of memory cells), a word line group, a word line, or individual memory cells. For example, the operations described with respect to a memory cell in the disclosure can also be used with a data block that is a group of memory cells.

Figure 2B:
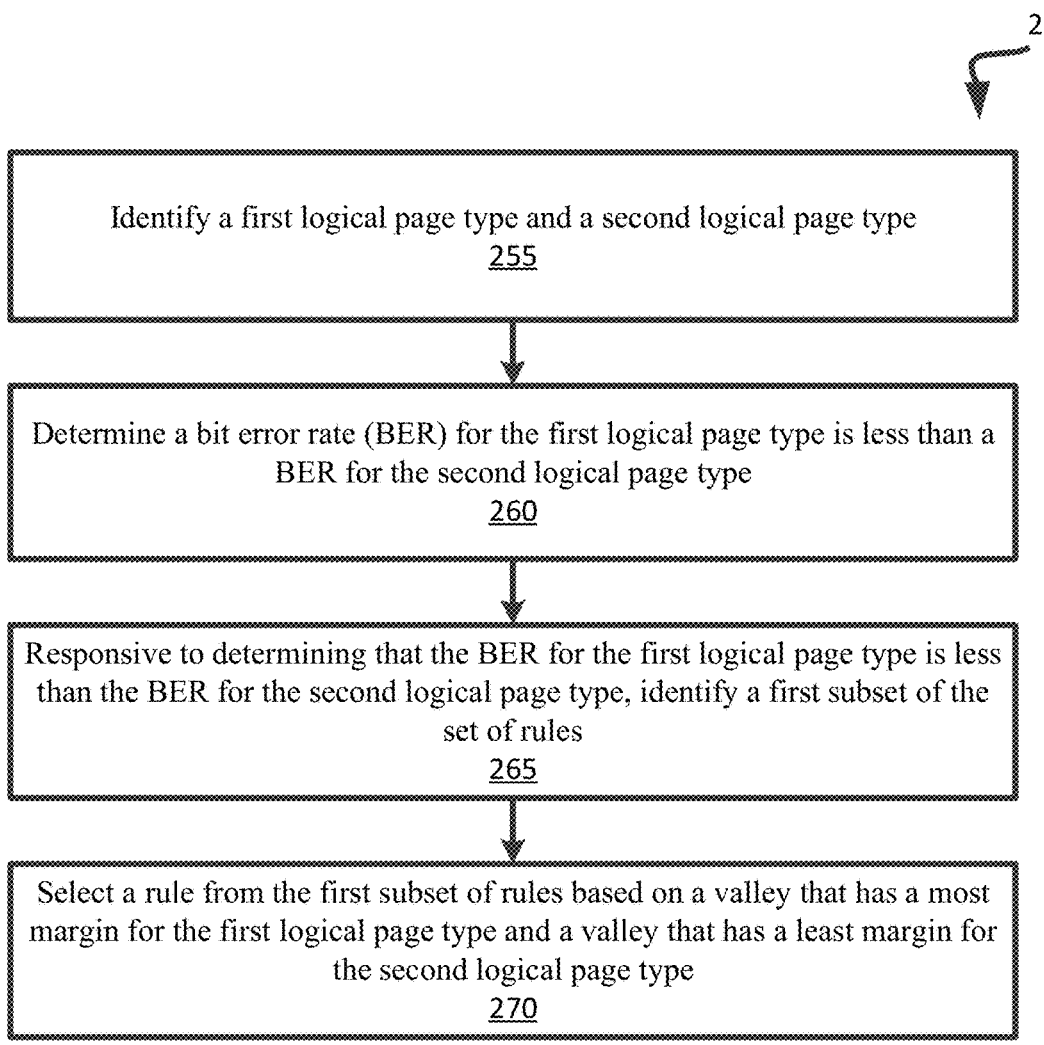
FIG. 2B is a flow diagram of an example method to select a rule from a set of rules, in accordance with some embodiments of the disclosure.

FIG. 2B is a flow diagram of an example method 250 to select a rule from a set of rules, in accordance with some embodiments of the disclosure. The method 250 can be performed by processing device that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the program targeting component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Method 250 illustrates a method of selecting a rule from a set of rules to adjust one or more PV targets as part of a program targeting operation. The set or rules correspond to an adjusting of a voltage of an erase distribution to move the position of the erase distribution in response to identifying a valley between the erase distribution and a programming distribution adjacent to the erase distributions (i.e., L1) has a lowest relative valley margin (e.g., a highest DiffEC).

At operation 255, processing device identifies a first logical page type and a second logical page type. In an example, the first logical page type and the second logical page type are different logical page types. For example, in QLC memory the first logical page type can be an LP and the second logical page type can be a TP, or vice versa.

At operation 260, processing device can determine whether a bit error rate (BER) for the first logical page type is less than or greater than a BER for the second logical page type. In some embodiments, to determine whether the BER for the first logical page type is less than or greater than the BER for the second logical page type, processing device compares a first average center bit error count (CenterEC) for the first logical page type to a second average center bit error count for the second logical page type. Processing device can determine that the BER for the first logical page type is less than the BER for the second logical page type if the first average center bit error count of the first logical page type is less than the second average center bit error count of the second logical page type. Processing device can determine that the BER for the first logical page type is greater than the BER for the second logical page type if the first average center bit error count is greater than the second average center bit error count. In an example, average CenterEC of a logical page type can be used to infer a relative BER of the particular page type with respect to other logical page types. For example, the average CenterEC of a LP can be compared to the average CenterEC of a TP. If the average CenterEC of the LP is greater than the average CenterEC of the TP, processing device can infer that the BER of the LP is greater than the BER of the TP.

At operation 265, responsive to determining that the BER for the first logical page type is less than the BER for the second logical page type, processing device identifies a first subset of the set of rules. The selected rule is from the first subset of rules.

Alternatively, responsive to determining that the BER for the first logical page type is greater than the BER for the second logical page type, processing device identifies a second subset of the set of rules. The selected rule is from the second subset of rules. For example, if the average CenterEC of the LP is less than the average CenterEC of the TP, processing device can select a first subset of the rules. If the average CenterEC of the LP is greater than the average CenterEC of the TP, processing device can select a second subset of the rules.

At operation 270, processing device identifies a rule from the first subset of rules based on a valley of the first logical page type that has a most margin and a valley of the second logical page type that has a least margin. In embodiments, the one or more difference error counts are used to determine the valley of the first logical page type that has the most margin and the valley of the second logical page type that has the least margin. For example, valley 8 (V8) of the LP can have the most margin (e.g., lowest Diff-EC) out of all the valley of LP. It can be noted that since the LP has only one corresponding valley (V8), V8 can be the valley that has the most margin (e.g., lowest Diff-EC) or the least margin (e.g., highest Diff-EC) for the LP. Continuing the example, one of the valleys (V1, V3, V5, V7, V9, V11, V13, or V15) of the TP can be determined to have the least margin of the valleys of the TP. For purposes of illustration, valley one (V1) of the TP has the least margin. A particular rule of the first subset of rules that corresponds to valley eight (V8) of LP having the most margin and valley one (V1) of TP having the least margin can be selected.

Alternatively, responsive to determining that the BER of the first logical page type is greater than the BER of the second logical page type, processing device identifies a rule from the second subset of rules based on a valley of that second logical page type that has a most margin and a valley of the first logical page type that has a least margin. For example, valley 8 (V8) of the LP can have the least margin (e.g., highest Diff-EC) out of the valley(s) of LP. One of the valleys (V1, V3, V5, V7, V9, V11, V13, or V15) of the TP can be determined to have the most margin out of the valleys of the TP. For purposes of illustration valley fifteen (V15) of the TP has the most margin. A particular rule of the first subset of rules that corresponds to valley eight (V8) of LP having the least margin and valley fifteen (V15) of TP having the most margin out the valleys of TP can be selected. Selecting a rule from a set of rules to adjust one or more PV targets as part of a program targeting operation is further described with respect to FIG. 5A through FIG. 5C.

Figures 3A, 3B:
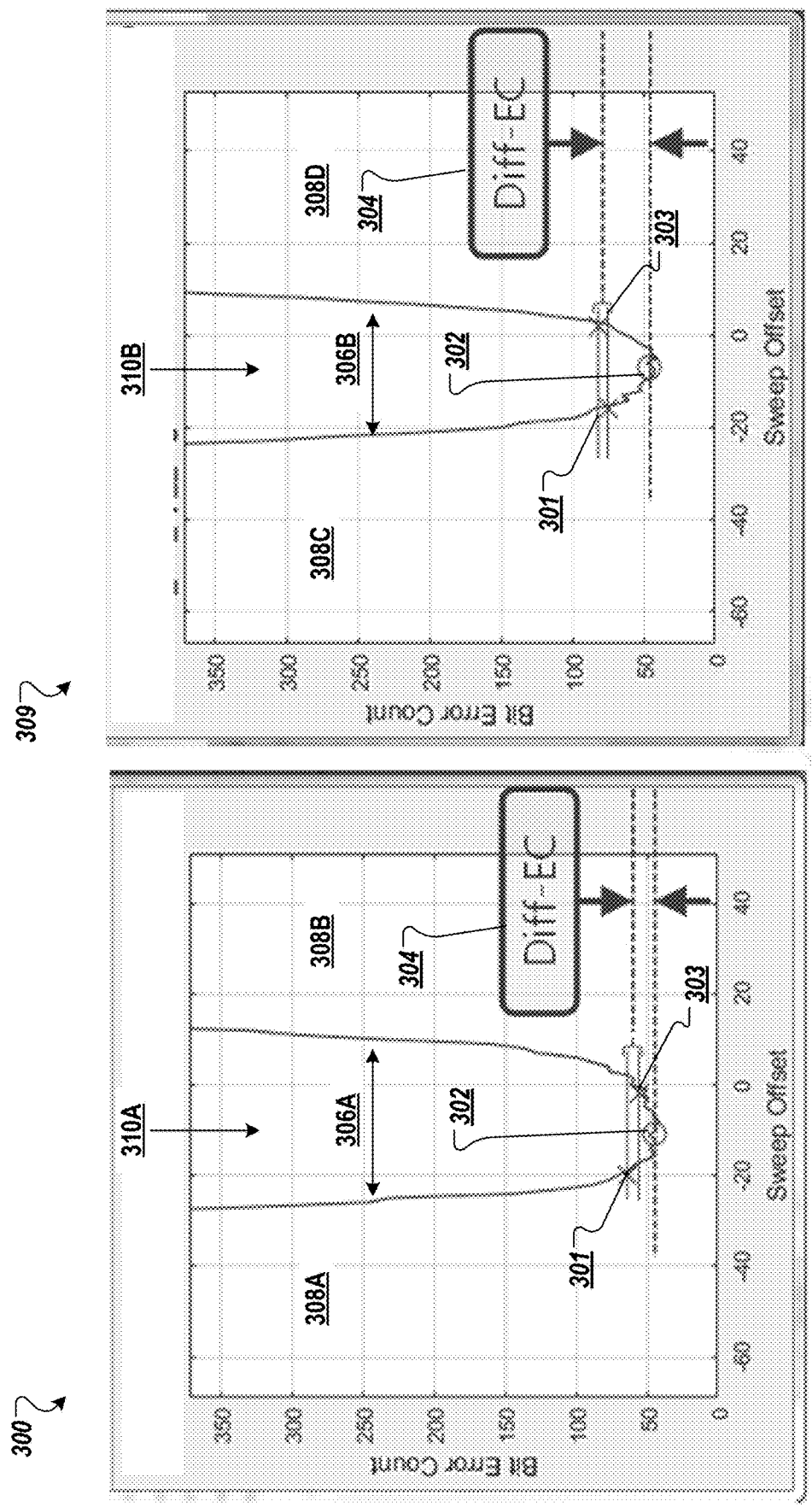
FIGS. 3A-3B illustrate difference error counts of two read level thresholds between two adjacent programming distributions, in accordance with some embodiments of the disclosure.

FIGS. 3A-3B illustrate difference error counts of two read level thresholds between two adjacent programming distributions, in accordance with some embodiments of the disclosure. Graph 300 shows a valley 310A between a pair of adjacent programming distributions 308A and 308B. Valley 310A-B can refer to the area between two adjacent distributions. Valley margin 306A is also shown between programming distributions 308A and 308B. Graph 309 shows a valley 310B between a pair of adjacent programming distributions 308C and 308D. Valley margin 306B is also shown between programming distributions 308C and 308D. As noted above, valley margin 306A-B can refer to a relative width or relative margin between pairs of adjacent programming distributions. One or more of programming distributions 308A-308D are generally referred to as "programming distribution(s) 308" herein. One or more of valley margins 306A-306B are generally referred to as "valley margin(s) 306" herein. One or more of valleys 310A-310B are generally referred to as "valley(s) 310" herein.

The cRLC operation samples each logical page type in each WLG. Each sample can include 3 reads: low-sample 301 (also referred to as "negative offset value" herein), center-sample 302 (also referred to as "center value" herein), and high-sample 303 (also referred to as "positive offset value" herein). As noted above, the cRLC operation calibrates or converges by obtaining a center value that results in a lowest bit error rate (BER) for a particular logical page type. Convergence is when a read level trim has the value that returns the fewest number of page or code word errors. This is what is called the calibrated or centered value and results in the best BER. In addition to finding the center of the valley 310, the cRLC operation calibrates or converges by balancing the side samples (low-Sample 301 and High-Sample 303) so that that the low-sample 301 and the high-sample 303 are equal in magnitude for a particular valley and the other valleys associated with a particular logical page type. In some embodiments, the low-sample 301 and the high-sample 303 are equal in magnitude for all the valleys for all the logical page types (or for multiple logical page types). In some embodiments, the low-sample 301 and the high-sample 303 are equal in magnitude for at least some valleys of a particular logical page type. Graph 300 and graph 309 show examples of calibrated valleys with the center samples 302 being balanced between the side samples (e.g., the 4 side samples in both graph 300 and 309 are roughly equal in magnitude). Graph 309 demonstrates wide valley behavior and graph 309 demonstrates narrow valley behavior. During cRLC sampling and updating, when the read level trims (e.g., trim registers) are centered, the value of the trim will start "dithering." Anytime a cRLC read level trim changes direction (increasing the trim value, then decreasing the trim value, and vice versa) is considered a dither. This action of dithering indicates the trim is centered. When dithering occurs for a trim, the center value will be set.

The center-samples 302 are used as feedback metrics by PT to equalize the LP/UP/XP error rates by moving PV targets slightly. For instance, the cRLC operation also obtains the center bit error count (CenterEC) by averaging the error count for the center sample of each trim (e.g., read level threshold). But, center-samples 302 are enough to equalize the BER between the logical page types (LP/UP/XP). For each logical page type, the valley margin can also have a reasonable match. The default PV targets can determine the depths of the valleys 310 between the programming distributions 308, the depths being related to valley margin 306 of each valley 310. To determine the valley margin 306 of a programming distribution 308, the cRLC operation can determine values of a metric that is indicative of the width (or depth) between adjacent pairs of programming distributions 308. In some embodiments, the metric is a difference error and values of the metric are Diff-EC (also referred to as "Diff-EC measurement(s)" herein). The difference error can be inversely proportional to the valley margins. For example, as illustrated the Diff-EC of graph 300 is smaller than the Diff-EC of graph 309, and valley margin 306A of graph 300 is larger than valley margin 306B of graph 309. The cRLC operation can determine the Diff-EC measurements 304. The Diff-EC measurements 304 can be used to identify relative valley margins. The Diff-EC measurements 304 can be the mean of the two side samples 301, 303 minus the center value 302. The PT operation can perform BER leveling by moving PV targets to match not only the error counts between logical page types (e.g., balancing), but also match the valley margins within each logical page type (or within all the logical page types) (e.g., equalizing). It can also be noted that valley margin can be correlated to valley depth (e.g., from peak to trough between programming distributions). For example, a deep valley can correlate to a narrower valley margin as compared to a shallow valley (e.g., less deep valley) that correlates to a wider valley margin.

It can be noted that the ECs of the center-samples 302 match when multiple valleys associated with logical pages are being measured (UP & XP). It can also be noted that the center-sample bit EC (also referred to as "center bit error count" or "CenterEC") can be the error count of the center-sample 302 (e.g., vertical axis of graph 300 and 309). Despite the center-sample ECs matchings, the valley margin (or depth) can be dramatically different even within the valley of different logical page types (UP & XP). To determine which valley has the largest valley margin or the smallest valley margin, the measure of Diff-EC can be reliably used. The higher the Diff-EC measurement 304, the narrower the valley margin (or the RWB is smaller). The offsets between the Low-Sample 301, Center-Sample 302, and High-Sample 303 for different Diff-EC measurements 304 are equal for purposes of comparison. In some embodiments, the cRLC operation can keep multiple samples (e.g., 16 samples) of each cRLC trim of each die. Once all the cRLC trim is centered, the center-samples 302 (and the corresponding CenterEC) and Diff-EC measurements 304 can be stored for a subsequent execution of a PT operation.

As illustrated, the example of FIG. 3A has a lower Diff-EC measurement 304 than the example of FIG. 3B, which means the programming distributions have a larger valley margin and is less-needy. The terms More-Needy and Less-Needy refer to the relative valley margins of valleys which apply to the same logical page type within a WLG. In other words, the Most-Needy valley for a logical page type will be the one that is dominating the Error Count or causing more BER loss than any other valley. The Diff-EC measurements can be used to determine More-Needy vs. Less-Needy valleys, including the order of Needy-Ness (most to least needy). For example, for a particular logical page type the valley with the largest Diff-EC is the Most-Needy valley (has the smallest valley margin) of the valley(s) of the particular logical page type. In another example, for a particular logical page type the valley with the smallest Diff-EC is the Least-Needy valley (has the largest valley margin) of the valley(s) of the particular logical page type. When a TLC page stack page BER is balanced, the LP (L3/L4) will have the lowest RWB, the UP (L1/L2 and L5/L6) will be a bit higher and should be about equal, and XP (L2/L3, L4/L5, and L6/L7, notice that L0/L1 is ignored because it is special) will be the highest RWB. Accordingly, the valleys of LP will have the lowest valley margins, the valleys of UP will have a bit higher valley margin, and the valleys of XP will have the highest valley margin. It should be noted that a balanced BER causes the RWB to gravitate (e.g., equalize) to a value where the RWB for valleys of a particular logical page type are approximately the same, which occurs as a natural byproduct of the PT operation.

Figure 5C:
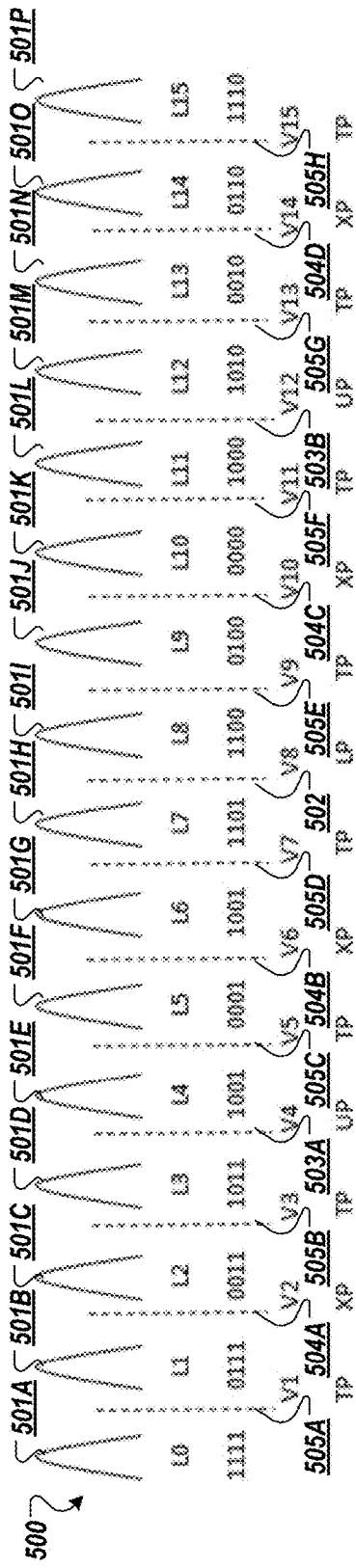
FIG. 5C illustrates an example set of rules that correspond to adjusting a voltage of an erase programming distribution, adjusting a program verify target of a last programming distribution, and a locking of a program verify target of a programming distribution adjacent to an initial programming distribution, in accordance with embodiments of the disclosure.

FIG. 4 illustrates eight distributions, including an erase distributions after the voltage is adjusted according to a PT operation, in accordance with some embodiments of the disclosure. As illustrated in FIG. 4, most of the data in each block is stored as TLC information, including 3 bits per cell. This is accomplished using an erase distribution 420 and seven programming distributions 422-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The erase distribution and programming distributions 420-434 each correspond to a level (L0:L7), each level corresponding to a code (000:111). Between each pair of eight programming distributions 420-434 is a valley, totaling seven valleys (v1:v7). A center or peak of each programming distribution 420-434 corresponds to a PV target for the respective programming distribution 420-432. In total, there can be eight PV targets for a 3-bit representation. In some embodiments, the erase distribution 420, corresponding to level L0, has an adjustable voltage to increase the valley margin of valley v1 when valley v1 is identified as the most needy valley. In some embodiments, the last programming distribution 434, corresponding to level L7, can have a fixed PV target and the erase distribution 420 has an adjustable PV target, as shown in FIG. 5A. In some embodiments, both the erase distribution 420 and the last programming distribution 434, corresponding to level L7, have adjustable positions, as shown in FIG. 5B. In some embodiments, the second programming distribution 422, corresponding to the second level L1, has a fixed PV target and the last programming distribution 434, corresponding to level L7, has an adjustable PV target, as shown in FIG. 5C.

Aspects of the present disclosure allow an adjustment of the voltage of the erase distribution when a valley between the programming distribution adjacent to the erase distribution (e.g., programming distribution 422) is identified as a most needy valley (e.g., valley V1 has the smallest valley width, highest DiffEC and highest BER). Using PT operations, the voltage of the erase distribution and, in some cases, the PV targets of additional programming distributions corresponding to levels L1-L7, can be adjusted. In FIG. 4, the programming distribution 420 has the lowest voltage level and is associated with the lowest PV target, and programming distribution 422 has the second lowest voltage level and the second lowest PV target. Programming distribution 434 has the highest voltage level and the highest PV target.

In the depicted embodiment, the PT operation starts with each PV target in a default state as defined by factory settings. In some cases, the voltage associated with the erase distribution can be adjusted to produce the adjusted erase distribution 420A (denoted by the dashed line in FIG. 4). In some embodiments, the second PV target of the second programming distribution (L1) and the last PV target of the last programming distribution (L7) can be fixed, allowing the intervening PV targets to be adjusted. For example, with eight PV targets (of L0-L7), the L7 PV target can be fixed and the other PV targets L1 through L6 can receive characterized starting values, leading to faster cRLC and PT operation conversion. Alternatively, the L1 PV target can be fixed and the other PV targets L2-L7 can be adjusted. These factory settings of the PV targets and read level thresholds can produce undesirable BER results before cRLC and PT operations.

In some embodiments, the PT operation can be defined as a net-zero PV target adjustment mechanism. Net-zero adjustments maintain a constant RWB for a memory cell. The total RWB for a memory cell of a multi-bit memory cell is constant, but the RWB between programming distributions can be adjusted by changing PV targets. Net-zero adjustments manages PV target adjustments for optimum BER and logical page type BER matching. The PT operation performs PV target adjustments in order to balance logical page type BER for improved BER sigma continuously throughout the life of a memory component or memory system. The PT operation, as described herein, can be performed between programming passes of a multi-pass programing operation, such as after a first programming pass or a second programming pass. The cRLC calibration is performed in order to perform a subsequent PT operation. The cRLC measures and collects center bit error count (CenterEC) and Diff-EC information on the page stack and passes the information to a subsequent PT operation. Both cRLC and PT can be performed while a block is being programmed rather than after a block is fully programmed.

In embodiments, during programming of the selected block used for PT, the programming sequence is interrupted to perform cRLC. Programming interruption occurs at each logical page stack (selected as one of the cRLC logical page stacks). A logical page stack can refer to all the logical page types for a particular multi-bit memory cell. The program interruption occurs just before the second-pass programming when the first-pass distributions have fully aggressed floating gate coupling from their neighbors. During block programming each of the cRLC page stacks in each of the wordline groups is interrupted and a cRLC is performed until all read level thresholds of the page stack are centered. The cRLC information from each valley, CenterEC and Diff-EC, is passed to the PT operation for determining PV target adjustments according to the PT rules. PV target adjustments are applied to the next block that is programmed and this process of interrupting and cRLC/PT continues as PT converges and finally dithers and then tracks NAND behavior. As noted above, by adjusting PV targets, PT effectively moves the programming distributions in the direction of the adjusted PV targets. PT calibration (e.g., adjusting the PV targets) can result in valley margins of a particular logical page type to converge at a particular convergence value so that the valley margins for a particular logical page type are roughly the same. PT calibration can include balancing the BER of each logical page type so that each logical page type has roughly similar BER. During PT PV target adjustment, when that value of the PV trim starts "dithering" (anytime a PV trim changes direction (increasing the trim value, then decreasing the trim value, and vice versa) is considered a dither), the PT operation for the respective programming distribution has converged.

A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by equalizing the BER of the LP page with respect to other logical pages. All PV targets can be stabilized after a number of P/E cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing BER equalization at time zero.

As described herein, BER balancing can be performed as a net-zero adjustment. As illustrated in FIG. 4, one click (e.g., 10 mv) is given to one level (e.g., labeled as +1) and one click (10 mv) is taken from another level (e.g., labeled as −1). In the example shown in FIG. 4, one click is taken from the erase distribution level (L0) and one click is given to the second programming level (L1) 422A to increase the margin between L0 and L1 by two clicks (e.g., 20 mv). According to embodiments, the shifts do not need to be integer-based, such that if the desired outcome of the PT operation is to maintain a margin of 1 between L0 and L1, L0 can be moved −0.5 and L1 can be moved +0.5. PT operations can adjust both UP and XP (and TP in QLC memory) relative to LP, resulting in BER balancing and RWB equalization of all three TLC logical page types (or all four logical page types in QLC memory). It should be noted that it is possible to give more RWB to higher distributions if required for undesirable NAND behavior like retention for example.

FIG. 5A illustrates an example set of rules that correspond to an adjusting of a voltage of an erase distribution (L0) and to a locking of a PV target of a last programming distribution (L15), in accordance with embodiments of the disclosure. Diagram 500 illustrates the erase distribution (L0) and programming distributions (L1-L15) of a QLC memory. The data in each block is stored as QLC information, including 4 bits per cell. This is accomplished using sixteen programming distributions 501A through 501P (generally referred to as "programming distributions 501"). A lower logical page (LP) is defined with one read level threshold 502 (e.g., approximately at the center between programming distributions 501H and 501I). An upper logical page (UP) is defined with two read level thresholds 503A and 503B (generally referred to as "read level threshold(s) 503" herein). An extra logical page (XP) is defined with fourth read level thresholds 504A-504D (generally referred to as "read level threshold(s) 504" herein). A top logical page (TP) is defined with eight read level thresholds 505A-505H (generally referred to as "read level threshold(s) 505" herein). The sixteen programming distributions 501A-501P each correspond to a level (L0:L15), each level corresponding to a code (0001:1111). In some embodiments, the code represents gray code. Gray code refers to a binary numeral system were two successive valleys differ in only one bit (e.g., binary digit). It can be noted that in other embodiments, a different gray code can be used. Between each pair of sixteen programming distributions 501A-501P is a valley, totaling fifteen valleys (V1: V15). Each of the valleys (V0:V15) are located between two adjacent programming distributions. For example, valley one (V1) is located between programming distributions 501A and 501B, and valley fifteen (V15) is located between programming distributions 501O and 501P. Each of the read level thresholds is centered in a corresponding valley (V1: V15). For example, read level threshold 502 is centered in valley eight (V8), read level threshold 505A is centered in valley one (V1), and so forth. A center or peak of each programming distribution 501A-501P corresponds to a PV target for the respective programming distribution 501A-501P. In total, there can be sixteen PV targets for a 4-bit representation. In some embodiments, the first programming distribution 501A, corresponding to the first level L0, has a fixed PV target. The second programming distribution 501B, corresponding to the second level L1, has fixed PV target and the last programming distribution 501P, corresponding to the sixteenth level L15, has an adjustable PV target. In some embodiments, the last programming distribution 501P, corresponding to the sixteenth level L15, can have a fixed PV target and second programming distribution 501B, corresponding to the second level L1, has and adjustable PV target. In some embodiments, both the second programming distribution 501B, corresponding to the second level L1, and the last programming distribution 501P, corresponding to the sixteenth level L15, have adjustable PV targets.

Aspects of the present disclosure allow a voltage of the erase distribution (L0) to be adjusted using a set of rules, as described herein. Using PT operations, the PV targets of the intervening programming distributions, corresponding to levels L1-L15, can be adjusted. It can be noted that the diagram 500 illustrates increasing voltage levels from left to right. For example, a programming distribution adjacent to the erase distribution corresponding to a lowest PV target is also referred to as the "second programming distribution" herein. A programming distribution (e.g., programming distribution 501P) corresponding to a highest PV target is also referred to the as the "last programming distribution" herein.

Set of rules 510 illustrates rules where the voltage of the erase distribution is allowed to move, the second programming distribution (L1) is allowed to move, and the last programming distribution (L15) is locked. It can be understood that the movement of the voltage of the erase distribution and the movement of a PV target associated with a particular programming distribution effectively moves the erase and programming distributions in the same direction and in equal magnitude that the voltage and PV target are moved. The set of rules 510 illustrate rules for performing a programming target operation (e.g., PT calibration). The set of rules 510 allows the program targeting operation to move the voltage of the erase distribution and identify which PV targets to move, if any, and in which direction and magnitude to move the identified PV targets. As noted above, the program targeting operation implements the set of rules to balance logical page types such that a bit error rate (BER) is approximately the same BER for different logical page types, and to equalize relative widths of valleys of a particular logical page type such that read window budgets (RWB) for the valleys of the particular logical page type are approximately a same RWB.

BER equalization can be performed as a net-zero adjustment. The program targeting operation can adjust UP, XP and TP relative to LP, resulting in equalization of all four QLC logical page types. For example, the valley margin for the LP can be reduced by one voltage trim level (e.g., −10 mV) and a valley margin of the XP can be increased by one voltage trim level (+10 mV) (or vice versa), such that a net-zero adjustment is performed. The column 511 illustrates set of rules are for TP-LP adjustments, such that that the TP is adjusted relative to the LP in a net-zero adjustment as described above. The set of rules 510 includes sixteen rules illustrated by cases 1-16. It can be noted that rules and cases are used interchangeably herein. In QLC memory, the TP page corresponds to the second programming distribution and the last programming distribution, the PV target adjustments for which are addressed in cases 1-16 of the set of rules 510. It can be noted that for TLC memory, the XP corresponds to the second programming distribution and the last programming distribution. A set of rules for XP-LP in TLC memory that adjust the second programming distribution and the last programming distribution corresponding to the XP of the TLC memory can be implemented in accordance with aspects of the disclosure. It can be noted that a QLC memory is described herein for purposes of illustration, rather than limitation. It can be further noted that aspects of this disclosure can apply to different multi-bit memory cells, such as TLC memory.

In some embodiments, to perform a program targeting operation to calibrate one or more PV targets associated the programming distributions 501 of a memory cell, a rule from set of rules 510 can be selected. The rule can identify which PV targets to adjust and the magnitude and direction of the adjustment (e.g., ±10 mV). It can be noted that the operations described with respect to FIG. 5A can be performed by program targeting component 113 as illustrated in FIG. 1.

In some embodiments, to select a rule from the set of rules, program targeting component 113 identifies that the valley between L0 and L1 is the most needy (per column 512) and adjusts the voltage of the erase distribution (L0), as denoted by the −1 in table 510.

In an example shown in case number 1 of table 510, the program targeting component 113 can identify that the valley of the TP has the highest Diff-EC (e.g., V1) as compared to the other valleys. In addition, the program targeting component 113 can also determine a valley (V8) of the LP has the lowest Diff-EC (e.g., note that LP is associated with only one valley, which can considered the valley of LP with the highest or lowest Diff-EC). A rule that increases the valley margin for V1 by increasing the voltage of the erase distribution (L0) while locking the PV target of L8 can be identified from the set of rules 510. The selected rule can identify the PV targets to adjust and the magnitude and direction of the adjustment, and program targeting component 113 can adjust the PV targets according to the identified rule.

In some embodiments, to select a rule from the set of rules 510, the program targeting component 113 identifies a first logical page type and a second logical page type. For example, in a QLC memory the program targeting component 113 can identify the TP and the LP. In some embodiments, for QLC memory the program targeting component 113 can identify the two logical page types as one of the following: TP-LP, XP-LP, and UP-LP. It can be noted that in some embodiments, the selection of the two logical page types can be based on a particular order. For example, the program targeting component 113 can adjust the TP-LP, followed by the XP-LP, followed by UP-LP, and so forth. It can also be noted that different sets of rules can be used for XP-LP, and UP-LP.

In some embodiments, to select a rule from the set of rules 510, the program targeting component 113 determines whether a BER for the first logical page type (e.g., LP) is less than or greater than a BER for the second logical page type (e.g., TP). In some embodiments, to determine whether the BER for the first logical page type is less than or greater than the BER for the second logical page type, program targeting component 113 compares a first average center bit error count (CenterEC) for the first logical page type to a second average center bit error count (CenterEC) for the second logical page type. The average CenterEC for a particular page type is indicative of the BER of the particular logical page type. In an example, the average CenterEC of the LP can be compared to the average CenterEC of the TP. The BER for the first logical page type (e.g., LP) is less than the BER for the second logical page type (TP) if the first average CenterEC is less than the second average CenterEC. The BER for the first logical page type (e.g., LP) is greater than the BER for the second logical page type (e.g., TP) if the first center bit error count (e.g., average CenterEC) is greater than the second center bit error count (e.g., CenterEC).

In some embodiments, responsive to determining that the BER for the first logical page type (e.g., LP) is less than the BER for the second logical page type (e.g., TP), program targeting component 113 identifies a first subset (e.g., LP<TP) of the set of rules 510. The selected rule is from the first subset of rules. For example, column "Average CenterEC" illustrates a first subset of the rules (e.g., cases 1-8) to apply when the BER (e.g., lower average CenterEC) of the LP is less than the BER (e.g., higher average CenterEC) for the TP.

In some embodiments, responsive to determining that the BER for the first logical page type (e.g., LP) is greater than the BER for the second logical page type (e.g., TP), program targeting component 113 identifies a second subset (e.g., TP<LP) of the set of rules 510. The selected rule is from the second subset of rules. For example, column "Average CenterEC" illustrates a second subset of the rules (e.g., cases 9-16) to apply when the BER (e.g., higher average CenterEC) of the LP is greater than the BER (e.g., lower average CenterEC) for the TP.

In some embodiments, subsequent to identifying the subset of rules, program targeting component 113 can select a rule from the identified subset of rules. In some embodiments, to identify the rule from the first subset of rules (e.g., cases 1-16), program targeting component 113 identifies a rule from the first subset of rules based on a valley (V8) that has a most margin for the first logical page type (e.g., LP) and a valley that has a least margin for the second logical page type (e.g., TP). In some embodiments, one or more difference error counts are used to determine the valley that has the most margin for the first logical page type (e.g., LP) and the valley that has the least margin for the second logical page type (e.g., TP).

In some embodiments, to identify the rule from the second subset of rules (e.g., cases 21-28), program targeting component 113 identifies a rule from the second subset of rules based on a valley that has a most margin for the second logical page type (e.g., TP) and a valley that has a least margin for the first logical page type (e.g., LP). In some embodiments, one or more difference error counts are used to determine the valley that has the most margin for the second logical page type (e.g., TP) and the valley that has the least margin for the first logical page type (e.g., LP).

Column 512 and column 513 of set of rules 510 illustrated "Neediness" of valleys for a particular logical page type. Neediness is based on the Diff-EC measurement. A lower Diff-EC measurement for a particular valley of a logical page type means that the particular valley has a larger valley margin and is less-needy that another valley of the same logical page type that has a higher Diff-EC measurement. The terms More-Needy and Less-Needy refer to the relative valley margins of valleys of the same logical page type. In other words, the Most-Needy valley for a logical page type will be the one that is dominating the Error Count (CenterEC) or causing more BER loss than any other valley of the same logical page type. The Diff-EC measurements can be used to determine More-Needy vs. Less-Needy valleys, including the order of Neediness (Most to Least Needy). For example, for a particular logical page type the valley with the largest Diff-EC is the Most-Needy valley (e.g., has the smallest valley margin) of the valley(s) of the particular logical page type. In another example, for a particular logical page type the valley with the smallest Diff-EC is the Least-Needy valley (e.g., has the largest valley margin) of the valley(s) of the particular logical page type.

As noted above, the program targeting operation calibrates a memory cell by balancing the logical page types such that the BER is approximately the same between the logical page types. To balance the BER, some of the RWB of a logical page type that has a lower BER will be given to a different logical page type with a higher BER. In the case 1 example shown in FIG. 5A, the voltage of the erase distribution is lowered to increase the margin of the Most Needy valley of the logical page type that has the higher BER (e.g., L1) will be increased in a net-zero adjustment. It can be noted that the since the BER of the LP is less than the BER of the TP, the first subset of the set of rules include rules that give RWB to the TP, and take RWB from the LP in a net-zero adjustment. In cases where the BER of the LP is greater than the BER of the TP, the second subset of rules include rules that give RWB to the LP, and take RWB from the TP in a net-zero adjustment.

In an example, program targeting component 113 identifies the LP and the TP as the two logical page types on which to perform a program targeting operation. Program targeting component 113 identifies the set of rules 510 that apply to performing a program targeting operation on the LP and TP logical page types (e.g., LP-TP Update). The program targeting component 113 determines that the BER for the LP is less than the BER for the TP. In order to make the aforementioned determination, the program targeting component 113 determines the average CenterEC for the LP is less than the average CenterEC for the TP. The average CenterEC for the LP being less than the average CenterEC for the LP indicates that the BER for the LP is less than the BER for the TP. By determining that average CenterEC is for the LP is less than the average CenterEC for the TP, program targeting component 113 identifies a first subset (e.g., LP<TP, which identifies cases 1-8) of the set of rules 510 that apply if the BER for the LP is less than the BER for the TP. To identify a specific rule from cases 9-20, program targeting component 113 identifies the Most Needy Valley of the TP and the Least Needy valley of the LP. The Most Needy valley of the TP is the valley that has the least relative width (e.g., the least margin) and the highest Diff-EC of the all the valleys of the TP. The Least Needy valley of the LP is the valley that has the largest relative width (e.g., the most margin) and the lowest Diff-EC for all the valleys of the LP. In a particular instance, valley one (V1) of the TP has the highest Diff-EC of all the valleys of the TP and is the Most Needy valley, and valley eight (V8) of the LP has the lowest Diff-EC of all the valleys of the LP and is the Least Needy valley. In the aforementioned condition, 513 can be identified as the rule in the first subset of set of rules 510 to apply (e.g., see columns 512 and 513 indicating Most Needy valley and Least Needy valley combinations).

In case 1 of set of rules 510, one voltage trim level (e.g., 10 mv) is taken from the erase distribution (labeled as −1) and one voltage trim level (e.g., 10 mv) is given to the PV targets of programming distributions L1:L7 (e.g., labeled as +1). The programming distributions L1:L7 are moved in an accordion-like manner, such that all the PV targets of programming distributions (L1:L7) are moved in the same direction and same magnitude. It can be noted that in case 1, RWB is given to valley 1 (V1) of the TP as PV target of the programming distribution L1 is moved to the right and the erase distribution is moved to the left. Valleys V2:V7 experience no change in relative width (or RWB) since all the PV targets for programming distributions L1:L7 shift to right by the same magnitude and direction (e.g., to the right by +10 mV). The corresponding valleys V2:V7 shift to the right a corresponding amount, but do not change in relative width. RWB is taken from valley 8 (V8) of the LP as the PV target of programming distribution L7 is moved to the right and the PV target of programming distribution L8 remains stationary. Valley 8 (V8) of the LP is squeezed to give margin to valley 1 (V1) of the TP in a net-zero adjustment.

In an embodiment, case 9 of the set of rules 510, is the opposite of case 1. In case 9, the BER of the LP is greater than the BER of the TP. The Most Needy valley of the LP is valley 8 (V8) of the LP, and the Least Needy valley of the TP is valley 1 (V1). In case 9, one voltage trim level (e.g., 10 mv) is taken from the erase distribution and from the PV targets of programming distributions L1:L7 (e.g., labeled as −1). The programming distributions L1:L7 are moved in an accordion-like manner, such that the erase distribution (L0) and the PV targets of programming distributions (L1:L7) are moved in the same direction and same magnitude. It can be noted that in case 9, RWB is taken from valley 1 (V1) of the TP as the PV target of the programming distribution L1 is moved to the left. Valleys V2:V7 experience no change in relative width (or RWB) since the erase distribution and the PV targets for programming distributions L1:L7 shift in the same direction and by the same magnitude (e.g., left by −10 mV). The corresponding valleys V2:V7 simply shift to the left a corresponding amount, but do not change in relative width. RWB is given to valley 8 (V8) of the LP as the PV target of programming distribution L7 is moved to the left (e.g., 10 mV) and the PV target of programming distribution L8 remains stationary. Valley 1 (V1) of the TP is reduced to give margin to valley 8 (V8) of the LP in a net-zero adjustment.

In an embodiment, the set of rules 510 are rules where programming distribution L15 is locked such that the PV target of programming distribution L15 is not adjusted by the program targeting operation. The blank spaces that are placed in the column designated by "L15" are used to illustrate that PV targets of programming distribution L15 are not allowed to be adjusted during a program targeting operation according to the set of rules 510.

FIG. 5B illustrates a set of rules that correspond to an adjusting of a PV target of a last programming distribution and a locking of a PV target of a programming distribution adjacent to an initial programming distribution, in accordance with embodiments of the disclosure. Diagram 500 of FIG. 5A is provided to help illustrate FIG. 5B. Set of rules 520 can be similarly implemented to set of rules 510, unless otherwise described. Set of rules 520 shows a set of rules where a position of the erase distribution can be moved and the PV target of the second distribution (L1) and the last distribution (L15) are allowed to be adjusted. In embodiments, set of rules 520 can be implemented as an alternative to other sets of rules for cases 1-16, as described herein. A couple of rules (i.e., cases) of set of rules 520 are described below to help illustrate implementations using set of rules 520.

In case 1 of set of rules 520, the BER of the LP is less than the BER of the TP. The Most Needy valley 512 of the TP is valley v1, and the Least Needy valley 513 of the LP is valley v8. One voltage trim level (e.g., −10 mv) is taken to the voltage of the erase distribution to provide additional margin to the most needy valley v1. The programming distributions L1:L7 are moved in an accordion-like manner, such that all the PV targets of the programming distributions (L1:L7) are moved in the same direction and same magnitude.

In an embodiment, in case 8, RWB is given to no valley, but the programming distribution (L15) is given additional margin away from the top voltage level limit. Moving programming distribution L15 to the left (−10 mV) gives additional margin between programming distribution L15 and the top voltage level limit. Valleys V9:V15 experience no change in relative width (or RWB) since all the PV targets for programming distributions L8:L15 shift to left by the same magnitude and direction (e.g., to the left by −10 mV). The corresponding valleys V9:V15 shift to the left a corresponding amount, but do not change in relative width. RWB is taken from valley 8 (V8) of the LP as the PV target of programming distribution L8 is moved to the left and the PV target of programming distribution L7 remains stationary. Valley 8 (V8) of the LP is reduced to give margin between the last programming distribution of the TP and the top voltage level limit in a net-zero adjustment.

In FIG. 5B, it can be noted that case 16 of set of rules 520, is the opposite of case 8. In case 16, the BER of the LP is greater than the BER of the TP. The Most Needy valley of the LP is valley 8 (V8), and the Least Needy valley of the TP is valley 15 (V15). In case 16, one voltage trim level (e.g., +10 mv) is given to the PV targets of programming distributions L8:L15 (e.g., labeled as +1). The programming distributions L8:L15 are moved in an accordion-like manner, such that all the PV targets of programming distributions L8:L15 are moved in the same direction and same magnitude. It can be noted that in case 16, RWB is taken from margin between programming distribution L15 and the top voltage level limit as PV target of the programming distribution L15 is moved to the right. Valleys V9:V15 experience no change in relative width (or RWB) since all the PV targets for programming distributions L8:L15 shift in the same direction and by the same magnitude (e.g., right by +10 mV). RWB is given to valley 8 (V8) of the LP as the PV target of programming distribution L8 is moved to the right (e.g., +10 mV) and the PV target of programming distribution L7 remains stationary. The margin between programming distribution L15 of the TP and the top voltage level limit is squeezed to give margin to valley 8 (V8) of the LP in a net-zero adjustment.

In FIG. 5B, it can be further noted that set of rules 520 include rules (e.g., for cases 1 and 9) where programming distribution L1 and L15 are not locked, but adjustments are made to the position of the erase distribution to provide additional margin to the most needy valley (e.g., valley v1 in case 1 and valley v8 in case 9). The blank spaces in the various column of table 520 are used to illustrate that PV targets of the corresponding programming distributions are not adjusted during a program targeting operation.

FIG. 5C illustrates a set of rules that correspond to cases where a voltage of an erase distribution and a PV target of a last programming distribution are adjustable, while a PV target of a second programming distribution (L1) is locked, in accordance with embodiments of the disclosure. Diagram 500 of FIG. 5A is provided to help illustrate FIG. 5C. The set of rules 530 can be similarly implemented to the set of rules 510 or the set of rules 520, unless otherwise described. The set of rules 530 shows a set of rules where the PV target of the second distribution (L1) is locked and the voltage of the erase distribution and the PV target of the last distribution (L15) are allowed to be adjusted. A couple of rules (i.e., cases) of set of rules 530 are described below to help illustrate implementations using set of rules 530. According to rule 1, based on a determination that valley v1 is the most needy, the voltage of the erase distribution is reduced (as denoted by the −1 in the table 530) to increase the valley margin of valley v1. Similarly, in case 9, based on a determination that valley v8 is the most needy valley and valley v1 is the least needy valley, the voltage of the erase distribution is reduced.

Figure 6:
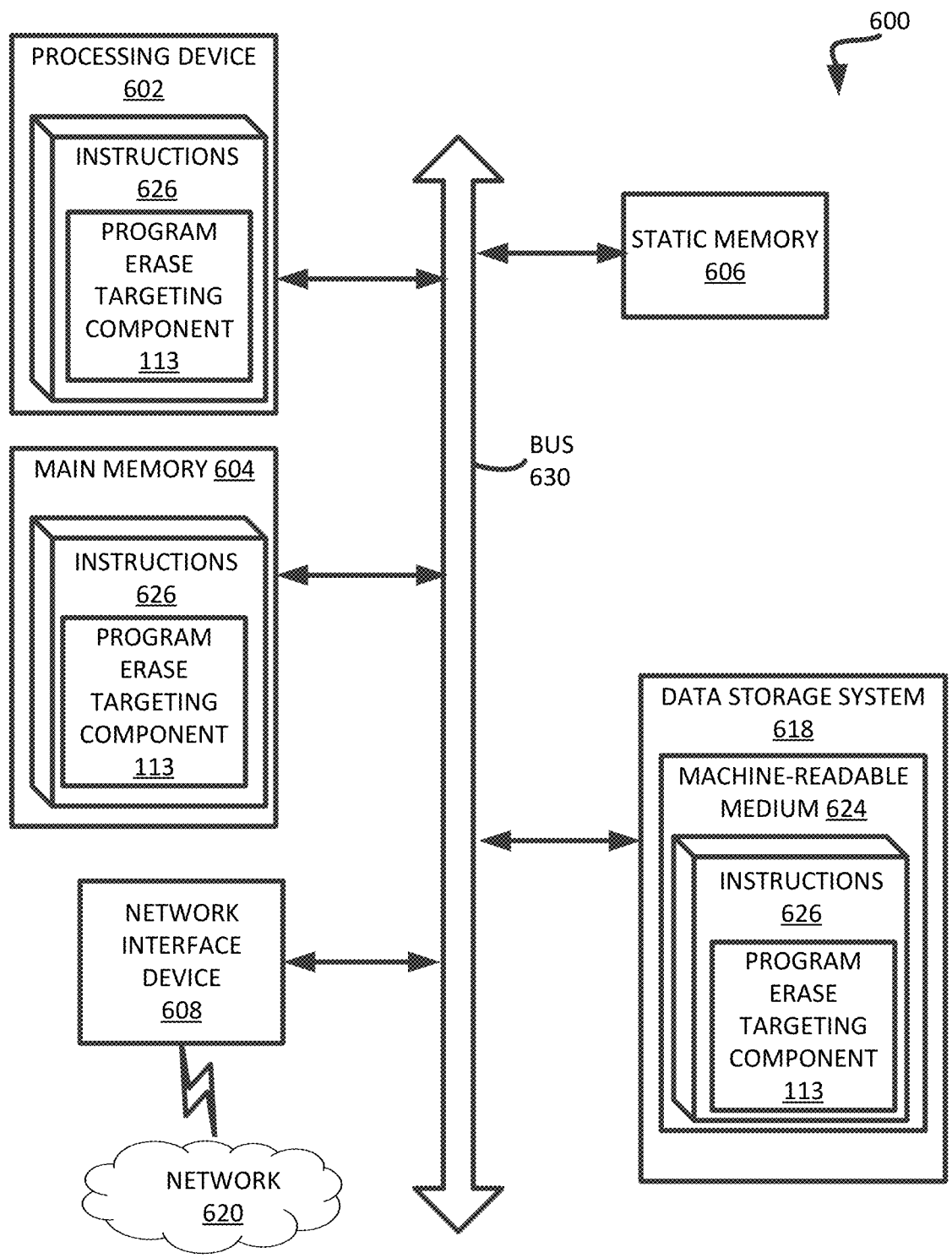
FIG. 6 illustrates an example machine of a computer system within which a set of instructions, for causing the machine to perform any one or more of the operations discussed herein, can be executed.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program targeting component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a non-transitory computer-readable storage medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the program targeting component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining, by a processing device, a set of difference error counts corresponding to a plurality of programming distributions of a memory sub-system;
    identifying, based on a comparison of the set of difference error counts, a plurality of valley margins corresponding to the plurality of programming distributions;
    selecting, based on a comparison of the plurality of valley margins, a program targeting rule from a set of rules; and
    performing, based on the program targeting rule, a program targeting operation to adjust a voltage associated with an erase distribution of the memory sub-system.

2. The method of claim 1, wherein a valley having a lowest valley margin of the plurality of valley margins is between the erase distribution and a programming distribution adjacent to the erase distribution.

3. The method of claim 2, wherein performing the program targeting operation comprises reducing the voltage associated with the erase distribution to increase a margin of the valley between the erase distribution and the programming distribution adjacent to the erase distribution.

4. The method of claim 2, further comprising determining that the valley having the lowest valley margin is associated with a highest difference error count of the set of difference error counts.

5. The method of claim 1, wherein a valley having a highest valley margin of the plurality of valley margins is between the erase distribution and a programming distribution adjacent to the erase distribution.

6. The method of claim 1, wherein the program targeting rule comprises locking of a program verify (PV) target of a programming distribution corresponding to a highest PV target.

7. The method of claim 1, wherein the program targeting rule comprises locking of a PV target of a second programming distribution adjacent to the erase distribution.

8. The method of claim 1, further comprising:
    adjusting, based on the program targeting rule, one or more PV targets of one or more of the plurality of programming distributions.

9. The method of claim 1, wherein the program targeting operation implements the program targeting rule to balance logical page types such that a bit error rate (BER) is approximately a same BER for different logical page types, and to equalize relative valley margins of a particular logical page type such that read window budgets (RWB) for the valleys of the particular logical page type are approximately a same RWB.

10. A non-transitory computer-readable storage medium comprising instructions that, when executed by a processing device, cause the processing device to:
    determine, by a processing device, a set of difference error counts corresponding to a plurality of programming distributions of a memory sub-system;
    identify, based on a comparison of the set of difference error counts, a valley having a lowest valley margin;
    select a program targeting rule from a set of rules, wherein the program targeting rule corresponds to the valley having the lowest valley margin; and perform, based on the program targeting rule, a program targeting operation to adjust a voltage associated with an erase distribution of the memory sub-system.

11. The non-transitory computer-readable storage medium of claim 10, wherein the valley having the lowest valley margin is between the erase distribution and a programming distribution adjacent to the erase distribution; and wherein the voltage associated with the erase distribution is reduced to increase the valley margin between the erase distribution and the programming distribution adjacent to the erase distribution.

12. The non-transitory computer-readable storage medium of claim 10, the processing device is further to determine the valley having the lowest valley margin is associated with a highest difference error count of the set of difference error counts.

13. A system comprising:
a memory component; and
a processing device, operatively coupled with the memory component, to perform operations comprising:
  determining, by a processing device, a set of difference error counts corresponding to a plurality of programming distributions of a memory sub-system;
  identifying, based on a comparison of the set of difference error counts, a plurality of valley margins corresponding to the plurality of programming distributions;
  selecting, based on a comparison of the plurality of valley margins, a program targeting rule from a set of rules; and
  performing, based on the program targeting rule, a program targeting operation to adjust a voltage associated with an erase distribution of the memory sub-system.

14. The system of claim 13, wherein a valley having a lowest valley margin of the plurality of valley margins is between the erase distribution and a programming distribution adjacent to the erase distribution.

15. The system of claim 14, wherein performing the program targeting operation comprises reducing the voltage associated with the erase distribution to increase a margin of the valley between the erase distribution and the programming distribution adjacent to the erase distribution.

16. The system of claim 14, the operations further comprising determining that the valley having the lowest valley margin is associated with a highest difference error count of the set of difference error counts.

17. The system of claim 13, wherein a valley having a highest valley margin of the plurality of valley margins is between the erase distribution and a programming distribution adjacent to the erase distribution.

18. The system of claim 13, wherein the program targeting rule comprises locking of a program verify (PV) target of a programming distribution corresponding to a highest PV target.

19. The system of claim 13, wherein the program targeting rule comprises locking of a PV target of a second programming distribution adjacent to the erase distribution.

20. The system of claim 13, the operations further comprising:
adjusting, based on the program targeting rule, one or more PV targets of one or more of the plurality of programming distributions.

* * * * *